(12) United States Patent
Lu et al.

(10) Patent No.: US 8,563,360 B2
(45) Date of Patent: Oct. 22, 2013

(54) POWER SEMICONDUCTOR DEVICE PACKAGE AND FABRICATION METHOD

(75) Inventors: Jun Lu, San Jose, CA (US); François Hébert, San Mateo, CA (US); Kai Liu, Mountain View, CA (US); Xiaotian Zhang, San Jose, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 394 days.

(21) Appl. No.: 12/479,995

(22) Filed: Jun. 8, 2009

(65) Prior Publication Data

US 2010/0308454 A1  Dec. 9, 2010

(51) Int. Cl.
*H01L 21/00* (2006.01)

(52) U.S. Cl.
USPC .......................................... 438/111; 438/113

(58) Field of Classification Search
USPC ................ 438/111, 107, 112, FOR. 377; 257/E21.505, E21.51, E21.513, 257/E23.047
See application file for complete search history.

(56) References Cited

U.S. PATENT DOCUMENTS

| 3,972,062 | A | 7/1976 | Hopp |
| 6,624,522 | B2 | 9/2003 | Standing et al. |
| 6,767,820 | B2 | 7/2004 | Standing et al. |
| D503,691 | S | 4/2005 | Standing et al. |
| 6,890,845 | B2 | 5/2005 | Standing et al. |
| 6,893,901 | B2 | 5/2005 | Madrid |
| 6,930,397 | B2 | 8/2005 | Standing et al. |
| 7,122,887 | B2 | 10/2006 | Standing et al. |
| 7,253,090 | B2 | 8/2007 | Standing et al. |
| 7,285,866 | B2 | 10/2007 | Standing et al. |
| 7,659,143 | B2 * | 2/2010 | Tang et al. ............ 438/107 |
| 7,944,046 | B2 * | 5/2011 | Chao .................... 257/713 |
| 2007/0091546 | A1 | 4/2007 | Standing et al. |
| 2007/0132017 | A1 | 6/2007 | Oikawa |
| 2007/0194441 | A1 | 8/2007 | Pavier |
| 2007/0202631 | A1 | 8/2007 | Standing |
| 2007/0284722 | A1 | 12/2007 | Standing |
| 2008/0054448 | A1 * | 3/2008 | Lu et al. ............... 257/707 |
| 2008/0066303 | A1 | 3/2008 | Standing |
| 2008/0079144 | A1 * | 4/2008 | Tang et al. ............ 257/706 |
| 2010/0224985 | A1 * | 9/2010 | Michael et al. ........ 257/692 |

\* cited by examiner

*Primary Examiner* — Jarrett Stark
*Assistant Examiner* — John M Parker
(74) *Attorney, Agent, or Firm* — James Cai; Schein & Cai LLP (57) ABSTRACT

A power semiconductor device package includes a conductive assembly including a connecting structure and a semiconductor die having an aperture formed therethrough, the aperture being sized and configured to spacedly receive the connecting structure. In an alternative embodiment, a power semiconductor device package includes a conductive assembly including a connecting structure and a pair of semiconductor die disposed on either side of the connecting structure in spaced relationship thereto.

4 Claims, 12 Drawing Sheets

POWER SEMICONDUCTOR DEVICE PACKAGE AND FABRICATION METHOD

BACKGROUND OF THE INVENTION

The present invention relates generally to semiconductor device packages and more particularly to a power semiconductor device package having a conductive assembly featuring a connecting structure.

Improvements in power semiconductor device packages provide for packages having higher power density through improved thermal dissipation structures and mechanisms as well as lower electrical resistance and reduced parasitic capacitances and inductances resulting from packaging materials and techniques. Techniques used to improve the performance of power semiconductor device packages include exposing top and bottom surfaces of the power semiconductor die so as to provide increased thermal dissipation, eliminating wire bonding so as to reduce parasitic effects, and reducing the package form factor and profile to achieve chip scale packaging. The simplification of fabrication steps provides for lower cost packaging solutions.

Figure 1:
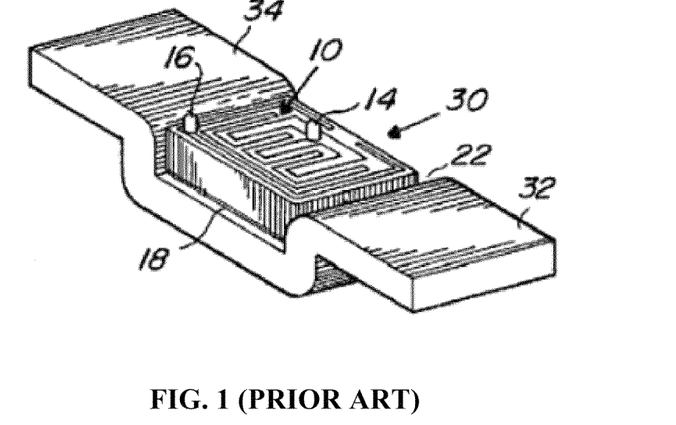
FIG. 1 is a perspective view of a prior art mounting assembly for a power semiconductor device package.

A prior art approach to improving the overall performance of power semiconductor device packages includes the provision of a mounting assembly such as disclosed in U.S. Pat. No. 3,972,062 entitled "Mounting assemblies for a plurality of transistor integrated circuit chips". Mounting assemblies 30 each include a transistor chip 10 mounted at a first electrode 18 thereof in a cavity 22 of the mounting assembly, as shown in FIG. 1. The assembly includes mounting or support pads or feet 32, 34. As mentioned heretofore, the terminals 16, 14, of the transistor chip 10 extend outwardly into a plane in which the feet 32, 34 of the mounting channel section lie. The feet 32, 34 of the mounting assembly provide support therefor as well as a connection to the transistor collector electrode of the chip. In addition, the overlying channel section protects the transistor chip, and more importantly, serves as a heat sink therefor in use.

Other similar designs are disclosed in U.S. Pat. Nos. 6,624,522, 7,122,887, 6,767,820, 6,890,845, 7,253,090, 7,285,866, 6,930,397, and 6,893,901, U.S. Published Patent Applications 2007/0091546, 2007/0194441, 2007/0202631, 2008/0066303, and 2007/0284722, and U.S. Design Pat. No. D503,691.

SUMMARY OF THE INVENTION

The power semiconductor device package of the invention includes a conductive assembly featuring a connecting structure. The connecting structure provides for connection between a semiconductor device terminal and an external mounting surface (e.g., printed circuit board (PCB)), for example. More specifically, the connecting structure may provide electrical connection from a second surface of a semiconductor die to the PCB, wherein the second surface is facing away from the PCB. Connection from the semiconductor device terminal(s) on the first surface of the semiconductor die may be made directly to the PCB, as the first surface is facing the PCB.

In accordance with another aspect of the invention, a power semiconductor device package includes a single semiconductor die, the connecting structure being disposed through an aperture formed in the semiconductor die.

In accordance with yet another aspect of the invention, a power semiconductor device package includes a pair of semiconductor die coupled in parallel, the connecting structure being disposed between the pair of semiconductor die.

In accordance with another aspect of the invention, a power semiconductor device package includes a conductive assembly including a connecting structure and a semiconductor die having an aperture formed therethrough, the aperture being sized and configured to spacedly receive the connecting structure.

In accordance with yet another aspect of the invention, a power semiconductor device package includes a conductive assembly including a connecting structure and a pair of semiconductor die disposed on either side of the connecting structure in spaced relationship thereto.

In accordance with another aspect of the invention, a power semiconductor device package includes a conductive assembly including a plate portion having a connecting structure depending therefrom and a semiconductor die electrically coupled to the plate portion, the semiconductor die having an aperture formed therethrough, the aperture being sized and configured to spacedly receive the connecting structure.

In accordance with yet another aspect of the invention, a power semiconductor device package includes a conductive assembly including a plate portion having a connecting structure depending therefrom and a pair of semiconductor die electrically coupled to the plate portion and disposed on either side of the connecting structure in spaced relationship thereto. The connecting structure may extend to be approximately coplanar to a side (and any contacts thereon) of the semiconductor die opposite the plate portion of the conductive assembly.

In accordance with yet another aspect of the invention, a method of fabricating a power semiconductor device package includes the steps of providing a conductive plate, spacedly forming trenches in the conductive plate, attaching semiconductor die such that a pair of semiconductor die are disposed between adjacent trenches, and dicing the conductive plate into the power semiconductor device packages such that a pair of semiconductor die are separated by a trench.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of design and to the arrangement of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent methods and systems insofar as they do not depart from the spirit and scope of the present invention.

BRIEF DESCRIPTION OF THE DRAWINGS

The present disclosure may be better understood and its numerous features and advantages made apparent to those skilled in the art by referencing the accompanying drawings wherein.

DETAILED DESCRIPTION OF THE INVENTION

Figure 2:
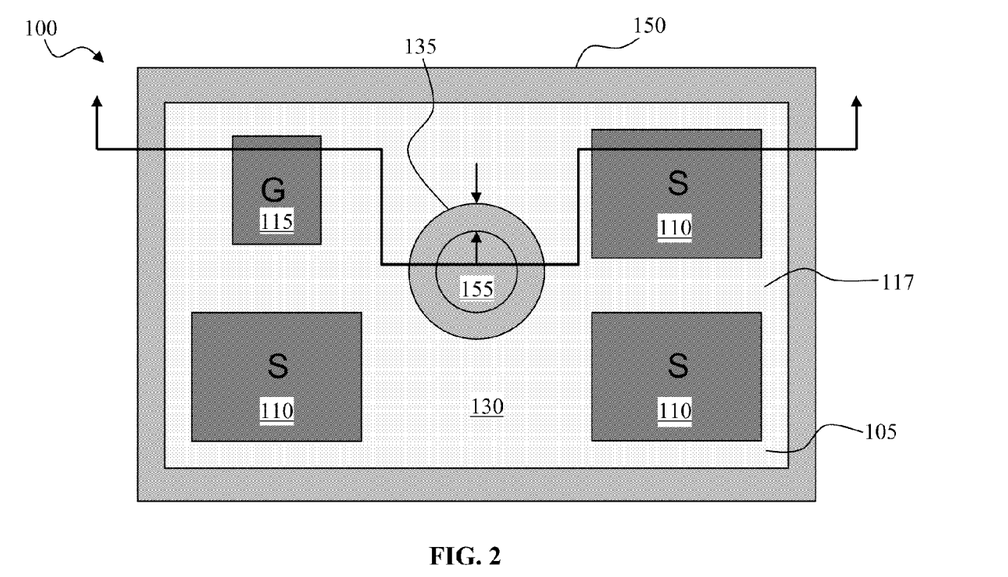
FIG. 2 is a schematic representation showing a bottom plan view of a power semiconductor device package in accordance with a first embodiment of the invention.
Figure 3:
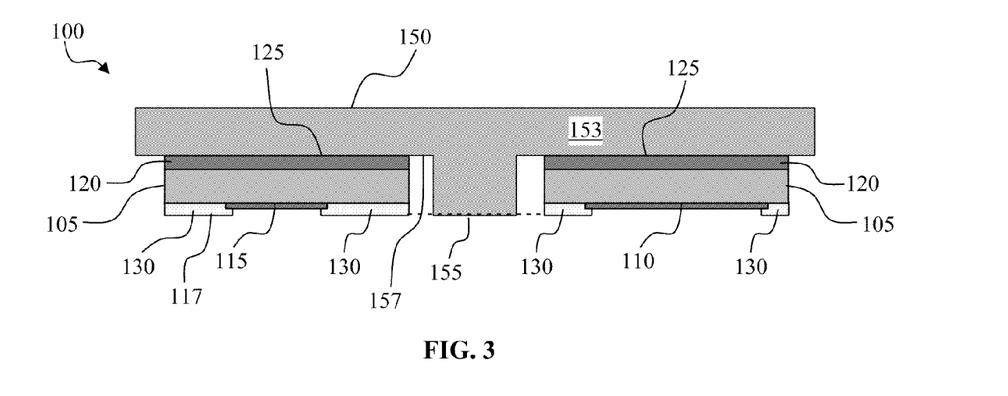
FIG. 3 is a schematic representation showing a cross sectional view of the power semiconductor device package in accordance with the first embodiment of the invention.

A first embodiment of a power semiconductor package 100 in accordance with the invention is shown in FIGS. 2 and 3. The power semiconductor package 100 includes a semiconductor die 105 having source contacts 110 and a gate contact 115 disposed on a first surface 117, the source contacts 110 and the gate contact 115 being insulated from each other by a passivation layer 130. The passivation layer 130 may include silicon oxide, silicon nitride, polyimide or a combination thereof. A drain contact 120 is disposed on a second surface 125 opposite the first surface 117. The semiconductor die 105 further includes a circular aperture 135 extending therethrough.

The power semiconductor package 100 further includes a conductive assembly 150 formed of an electrically conductive material for accommodating the semiconductor die 105. The conductive assembly 150 advantageously provides for heat dissipation and electrical conductivity. The conductive assembly 150 includes a plate portion 153 of rectangular configuration to which is electrically connected the drain contact 120 of the semiconductor die 105 and a cylindrical connecting structure 155. The cylindrical connecting structure 155 depends from the plate portion 153 and extends from a plate portion bottom surface 157 past semiconductor die 105. In the present example, one end of cylindrical connect structure 155 is substantially co-planar with the passivation layer 130 and the gate and source contacts 115, 110.

The semiconductor die 105 is attached to the plate portion bottom surface 157 by any suitable means such as conductive solder, epoxy and the like so that the cylindrical connecting structure 155 is spacedly disposed through the circular aperture 135 formed in the semiconductor die 105. The cylindrical connecting structure 155 provides electrical connectivity between the drain contact 120 and a mounting substrate such as a printed circuit board (not shown). In this embodiment, the aperture 135 is located approximately in the center of the electrically conductive assembly 150.

Figure 4:
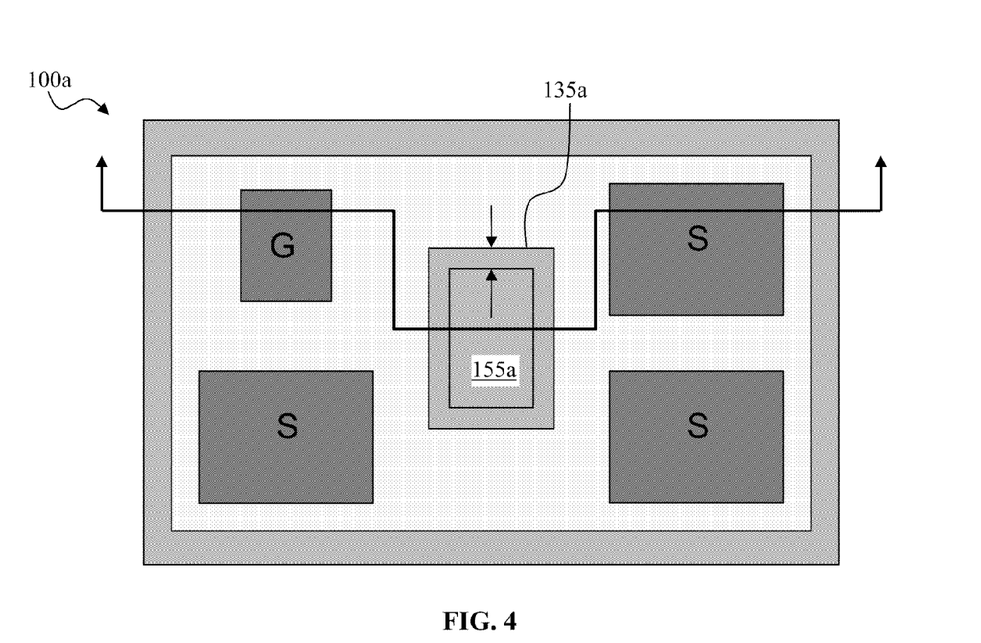
FIG. 4 is a schematic representation showing a bottom plan view of a power semiconductor device package in accordance with a second embodiment of the invention.
Figure 5:
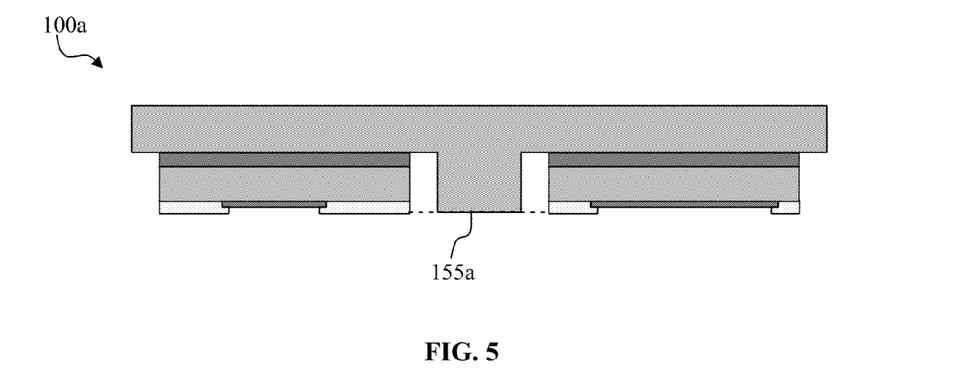
FIG. 5 is a schematic representation showing a cross sectional view of the power semiconductor device package in accordance with the second embodiment of the invention.

A second embodiment of a power semiconductor device package 100a in accordance with the invention is shown in FIGS. 4 and 5. The power semiconductor device package 100a is in all respects identical to the power semiconductor device package 100 with the exception that the connecting structure 155a and the aperture 135a are each rectangular in shape.

Figure 6:
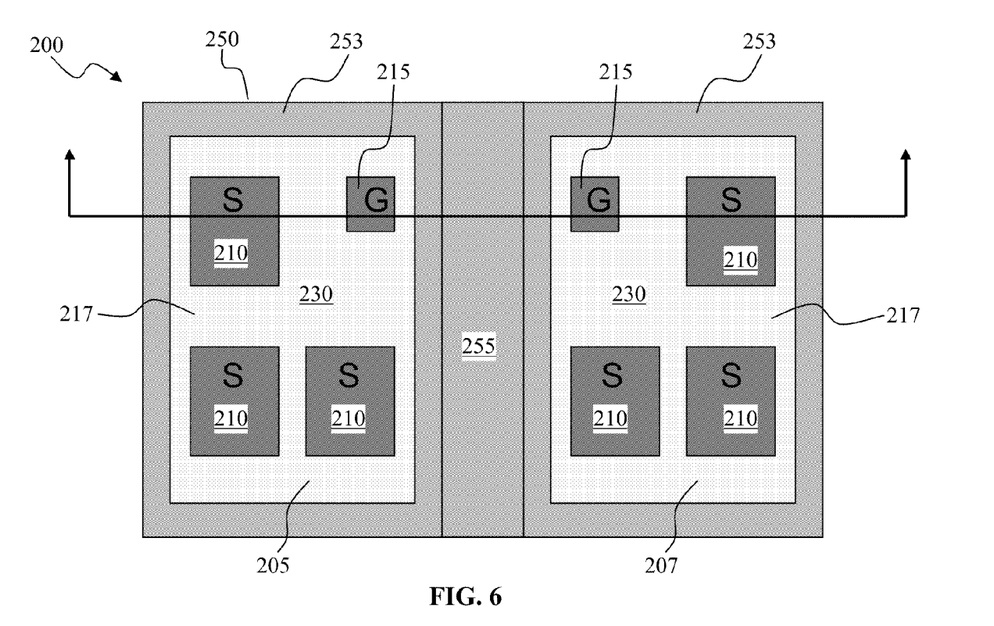
FIG. 6 is a schematic representation showing a bottom plan view of a power semiconductor device package in accordance with a third embodiment of the invention.
Figure 7:
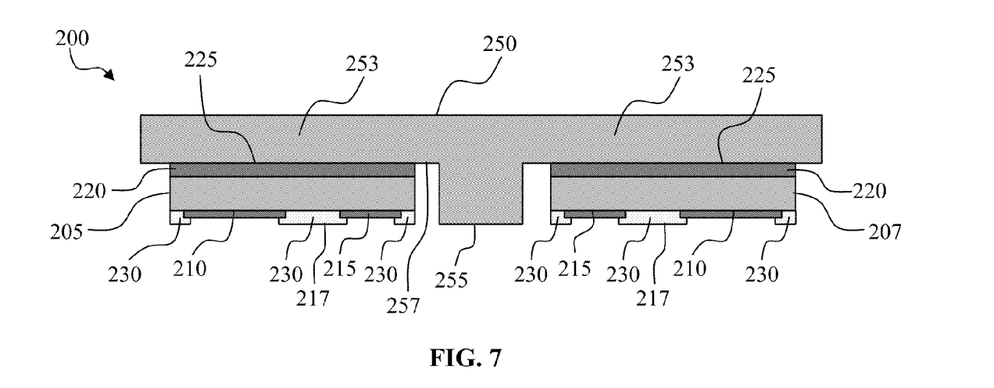
FIG. 7 is a schematic representation showing a cross sectional view of the power semiconductor device package in accordance with the third embodiment invention.
Figure 8:
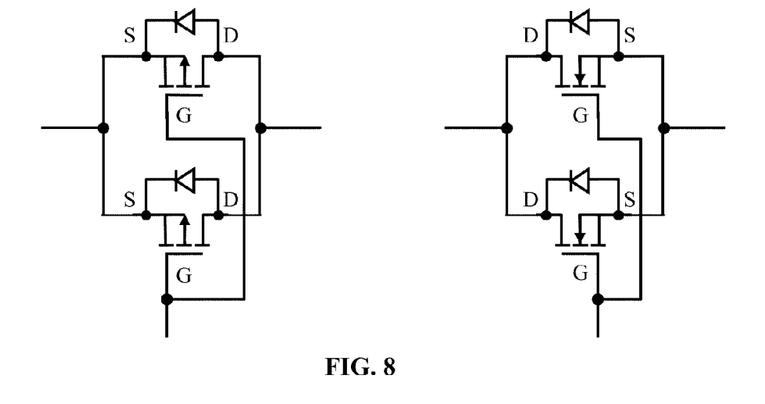
FIG. 8 is a schematic representation showing a pair of semiconductor die coupled in parallel in accordance with the third embodiment invention.

A third embodiment of a power semiconductor device package 200 in accordance with the invention is shown in FIGS. 6 and 7. In contrast to the first and second embodiments, the third embodiment includes a pair of semiconductor dies 205 and 207. Semiconductor dies 205 and 207 may include a pair of P FET devices or a pair of N FET devices coupled in parallel to thereby act as a single device as shown in FIG. 8. The semiconductor dies 205 and 207 each include source contacts 210 and a gate contact 215 disposed on a first surface 217, the source contacts 210 and the gate contact 215 being insulated from each other by a passivation layer 230. The passivation layer 230 may include SiO, SiN, polyimide or a combination thereof. A drain contact 220 is disposed on a second surface 225 semiconductor dies 205 and 207 opposite the first surface 217.

The power semiconductor device package 200 further includes a conductive assembly 250 formed of an electrically conductive material for accommodating the semiconductor dies 205 and 207. The conductive assembly 250 with its connecting structure 255 is generally "T" shaped and advantageously provides for thermal dissipation and electrical conductivity. The conductive assembly 250 includes a plate portion 253 of rectangular configuration to which is electrically connected the drain contacts 220, and a connecting structure 255. The connecting structure 255 depends from the plate portion 253 and extends from a plate portion bottom surface 257 to a position generally co-planar with the passivation layer 230 (and the source and gate contacts 210, 215). In contrast to the connecting structures 155 and 155a of the first and second embodiments, the connecting structure 255 extends along the width of the conductive assembly 250.

The semiconductor dies 205 and 207 are attached through their drain contacts 220 to the plate portion bottom surface 257 on either side of the connecting structure 255 by means of a conductive epoxy (or solder or equivalent material, not shown) in such manner that the semiconductor dies 205 and 207 are spacedly disposed from the connecting structure 255. The connecting structure 255 provides electrical connectivity between the drain contact 220 and a substrate such as a printed circuit board (not shown).

Figure 9:
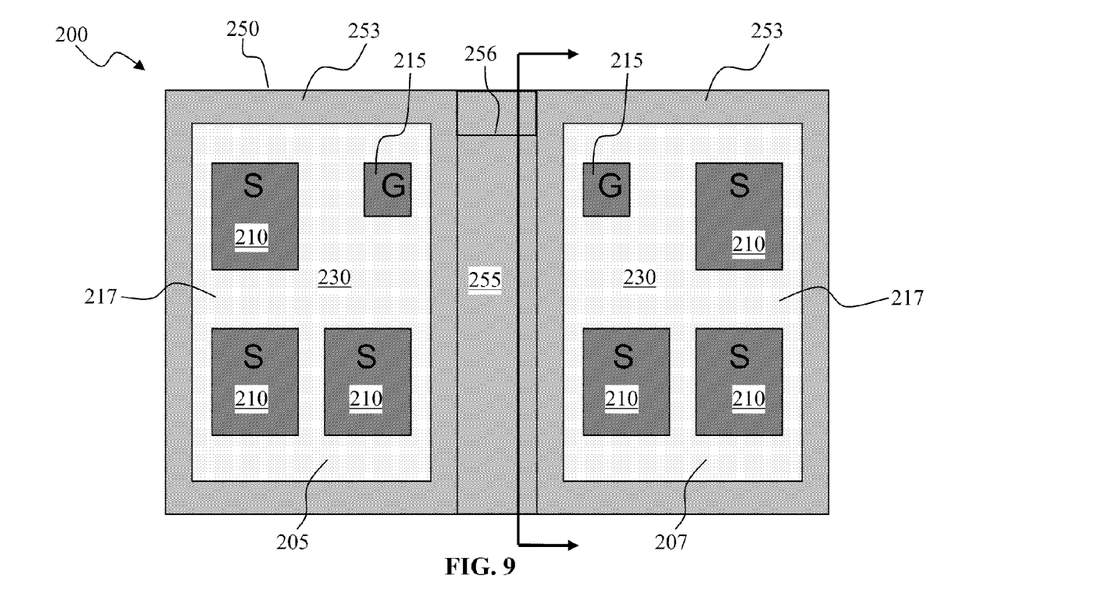
FIG. 9 is a schematic representation showing a bottom plan view of a power semiconductor device package in accordance with an alternative version of the invention.
Figure 10:
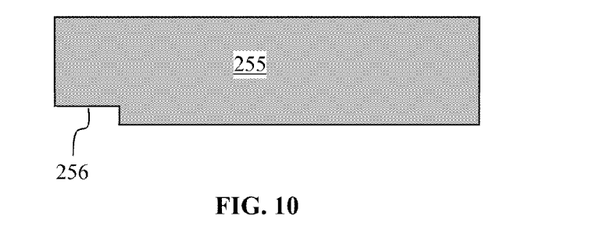
FIG. 10 is a schematic representation showing a cross sectional view of the power semiconductor device package in accordance with an alternative version of the invention.

An alternative version of the power semiconductor package 200 is shown in FIGS. 9 and 10. The connecting structure 255 has a notch 256 on its bottom surface which allows the mounting substrate (e.g., PCB) to route the source 210 electrodes of the semiconductor dies 205 and 207 together under the connecting structure 255, and to also route the gates 215 of the semiconductor dies 205 and 207 together. In this embodiment, the internal routings can all carried out within the footprint of the semiconductor device package. Alternatively, the notch 256 could also be located at the center of connecting structure 255 rather than at one of its ends.

Figure 11:
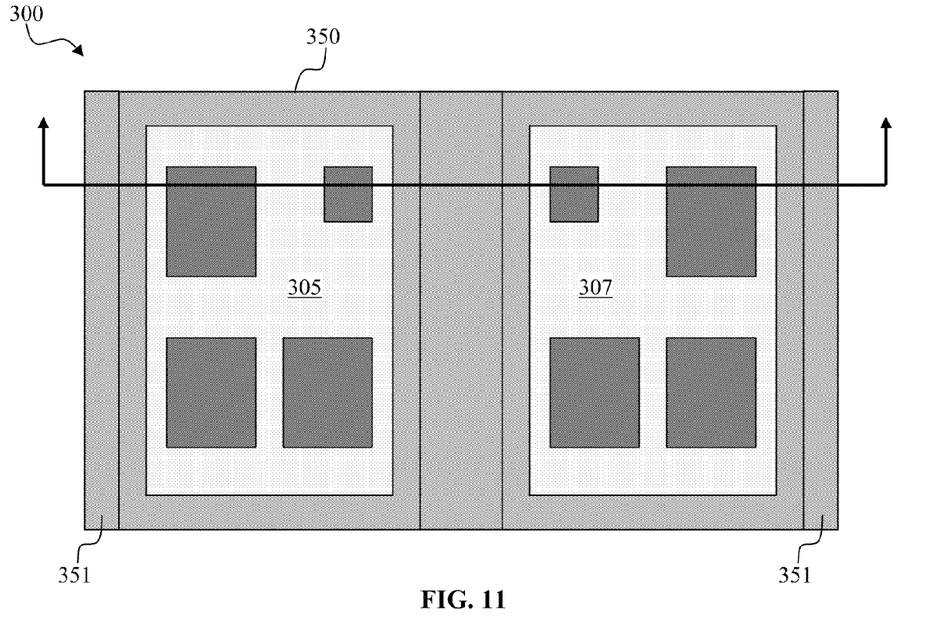
FIG. 11 is a schematic representation showing a bottom plan view of a power semiconductor device package in accordance with a fourth embodiment of the invention.
Figure 12:
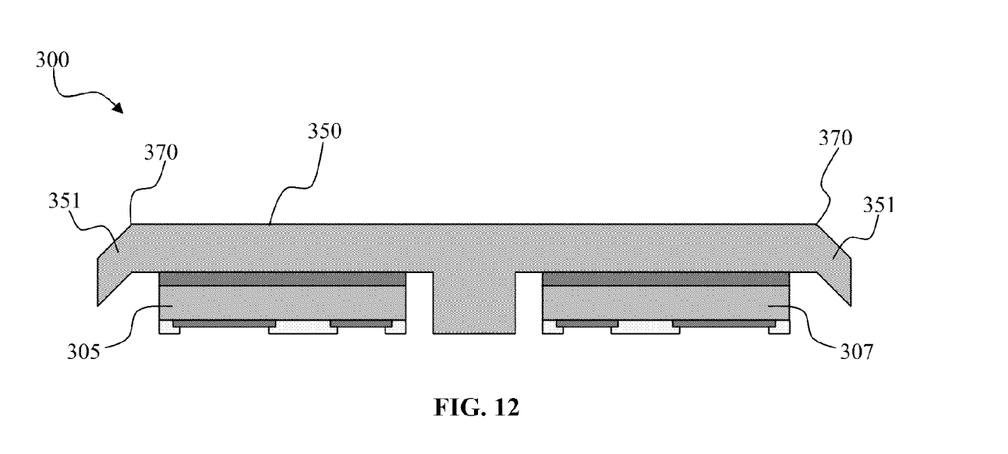
FIG. 12 is a schematic representation showing a cross sectional view of the power semiconductor device package in accordance with the fourth embodiment of the invention.

A fourth embodiment of a power semiconductor device package 300 in accordance with the invention is shown in FIGS. 11 and 12. In contrast to the third embodiment, the conductive assembly 350 is generally "M" shaped and includes a set of wings 351. The set of wings 351 depend angularly from edges 370 of the conductive assembly 350. The set of wings 351 provide protection to the semiconductor dies 305 and 307 such as during handling and processing of the power semiconductor device package. Advantageously, the fabrication of the power semiconductor device package 300 does not require additional process steps. After mounting, the connections for the terminals on the front side of the wafer can still be visually inspected from the side.

Figure 13:
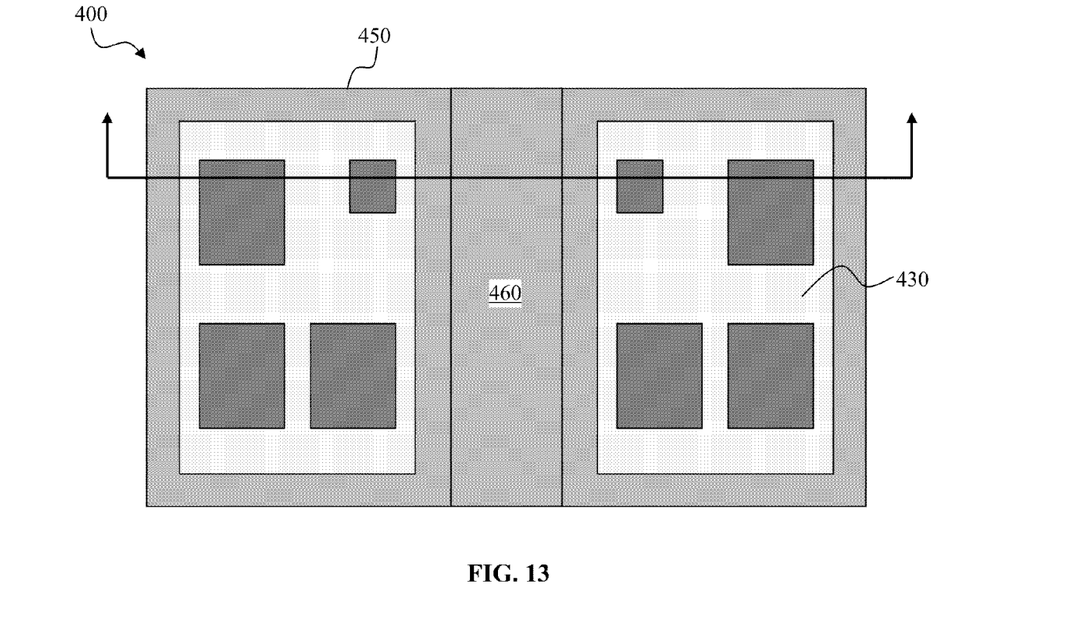
FIG. 13 is a schematic representation showing a bottom plan view of a power semiconductor device package in accordance with a fifth embodiment of the invention.
Figure 14:
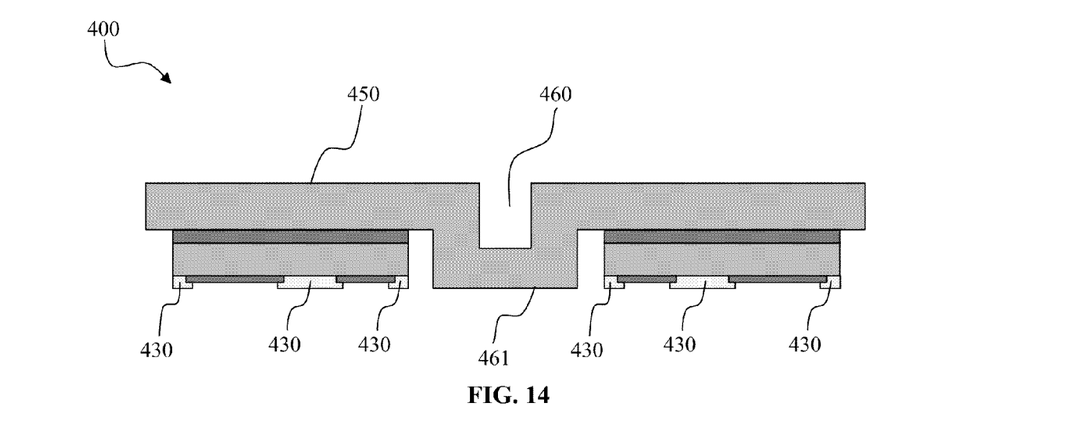
FIG. 14 is a schematic representation showing a cross sectional view of the power semiconductor device package in accordance with the fifth embodiment of the invention.

A fifth embodiment of a power semiconductor device package 400 in accordance with the invention is shown in FIGS. 13 and 14. In contrast to the third and fourth embodiments, the conductive assembly 450 has a trench 460 formed at a midpoint thereof. The trench 460 serves as the connecting structure of the conductive assembly 450. A bottom portion 461 of the trench 460 is approximately co-planar with a passivation layer 430. The trench 460 is advantageously fabricated by stamping a conductive plate, which is a quick, simple and economical manufacturing process.

Figure 15:
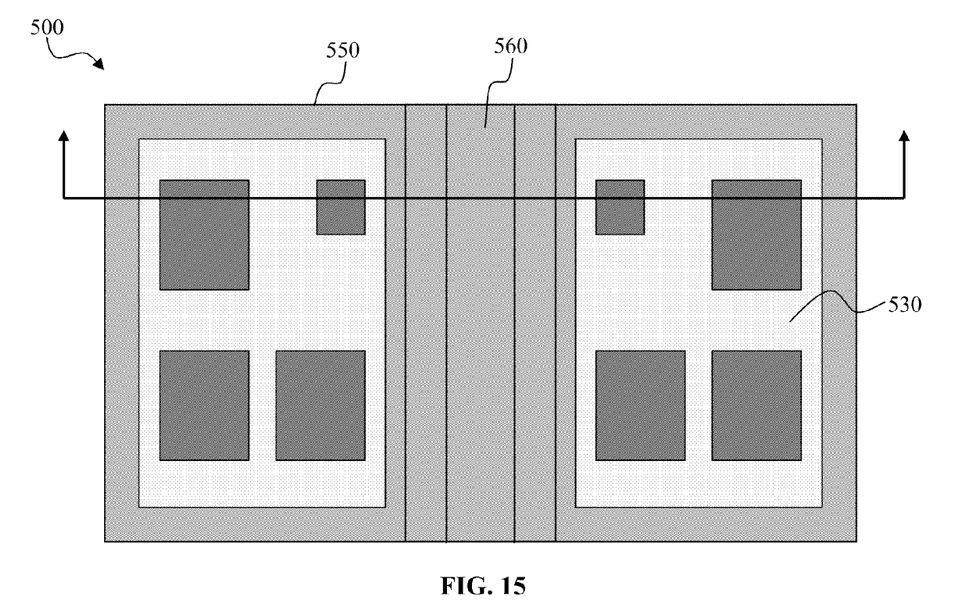
FIG. 15 is a schematic representation showing a bottom plan view of a power semiconductor device package in accordance with a sixth embodiment of the invention.
Figure 16:
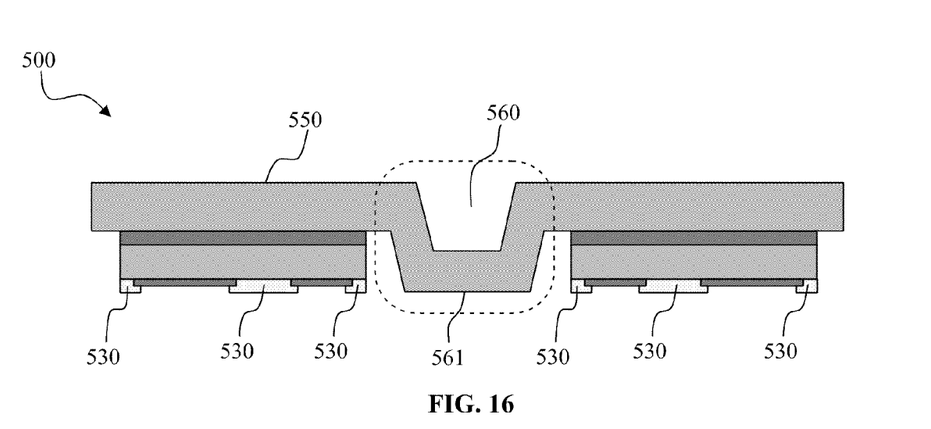
FIG. 16 is a schematic representation showing a cross sectional view of the power semiconductor device package in accordance with the sixth embodiment of the invention.

A sixth embodiment of a power semiconductor device package 500 in accordance with the invention is shown in FIGS. 15 and 16. In contrast to the fifth embodiment, the conductive assembly 550 has a trench 560 formed at a midpoint thereof and having angled walls. A bottom portion 561 of the trench 560 is co-planar with a passivation layer 530. The trench 560 is advantageously formed by stamping a conductive plate. Alternatively, the trench 560 may have a "W" shape profile as shown in FIG. 17.

Figure 18:
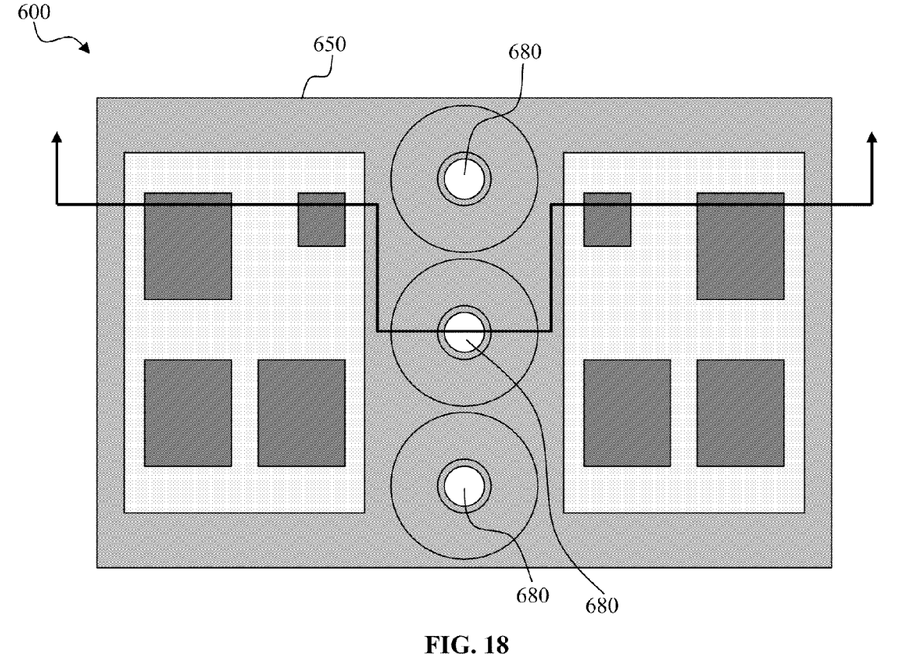
FIG. 18 is a schematic representation showing a bottom plan view of a power semiconductor device package in accordance with a seventh embodiment of the invention.
Figure 19:
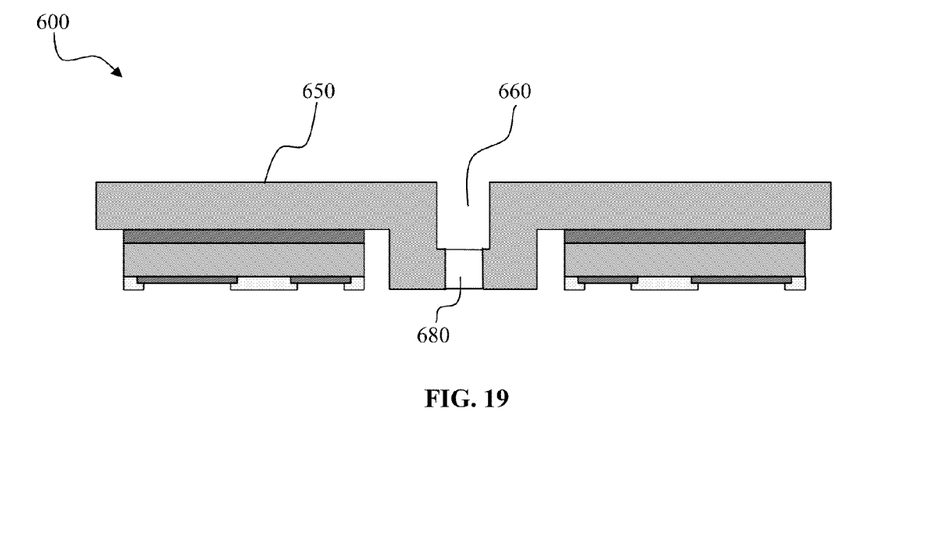
FIG. 19 is a schematic representation showing a cross sectional view of the power semiconductor device package in accordance with the seventh embodiment of the invention.

A seventh embodiment of a power semiconductor device package 600 in accordance with the invention is shown in FIGS. 18 and 19. In contrast to the fifth embodiment, the conductive assembly 650 includes apertures 680 formed in trenches 660. The trenches 660 have a cylindrical shape, such that the connecting structure has the form of posts. The apertures 680 are shown as being circular but can be of any configuration and provide for better solderability and improved reliability.

Figure 17:
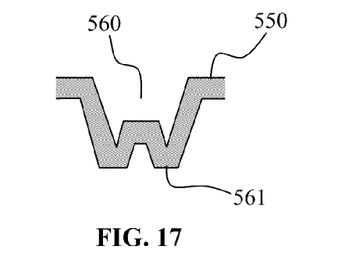
FIG. 17 is a schematic representation showing a cross sectional view of an alternative portion of the power semiconductor device package in accordance with the sixth embodiment of the invention.
Figure 20:
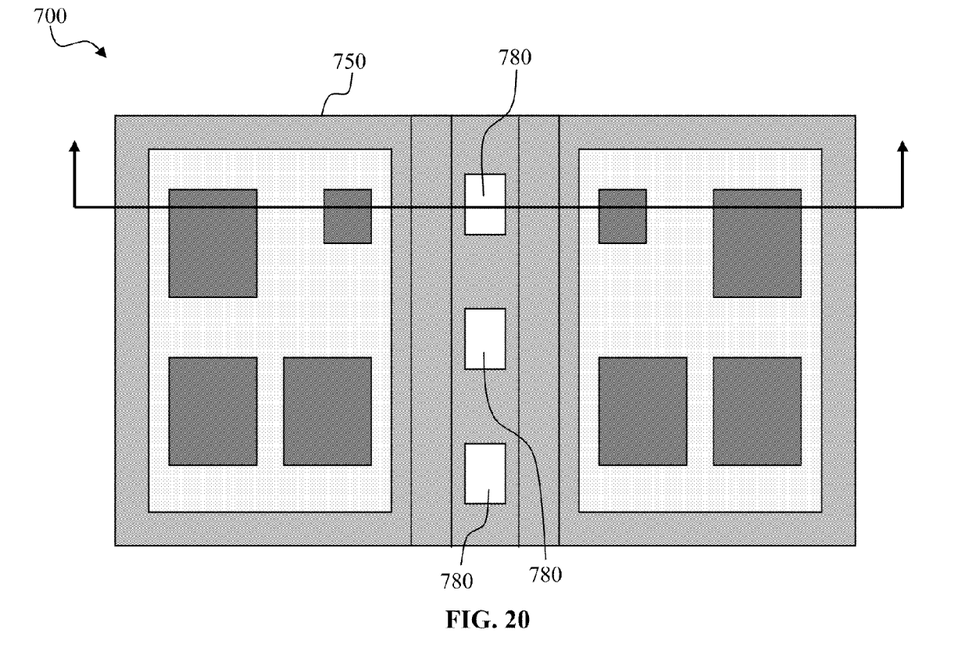
FIG. 20 is a schematic representation showing a bottom plan view of a power semiconductor device package in accordance with a eighth embodiment of the invention.
Figure 21:
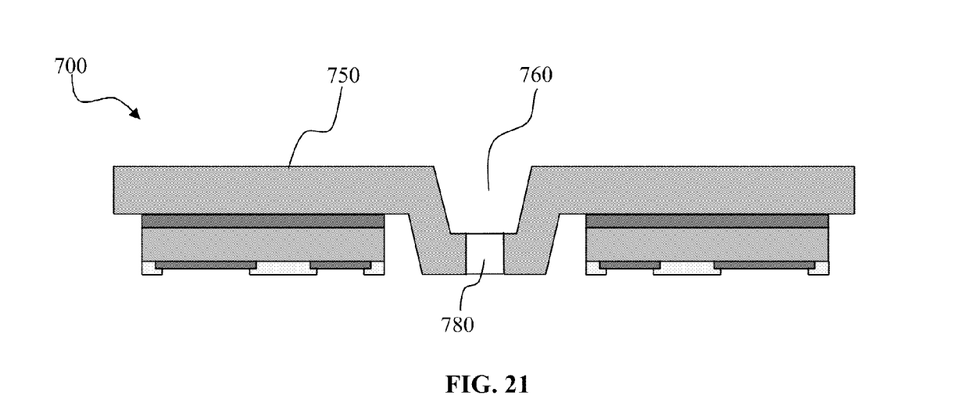
FIG. 21 is a schematic representation showing a cross sectional view of the power semiconductor device package in accordance with the eighth embodiment of the invention.
Figure 22:
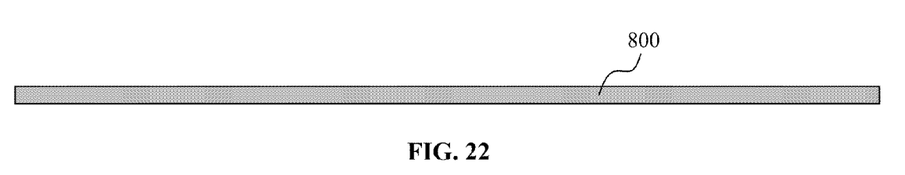
FIGS. 22-25 schematically show fabrication steps in accordance with the invention.
Figure 23:
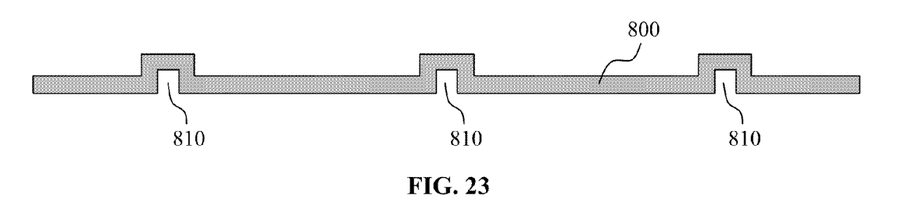
Figure 24:
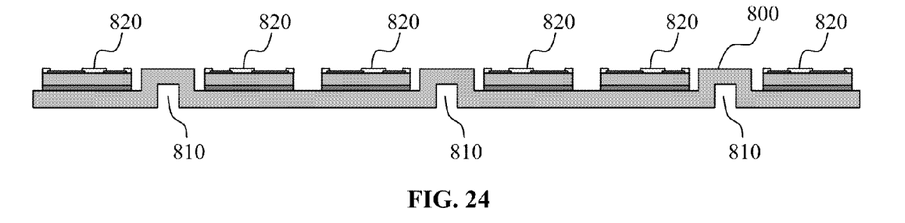
Figure 25:
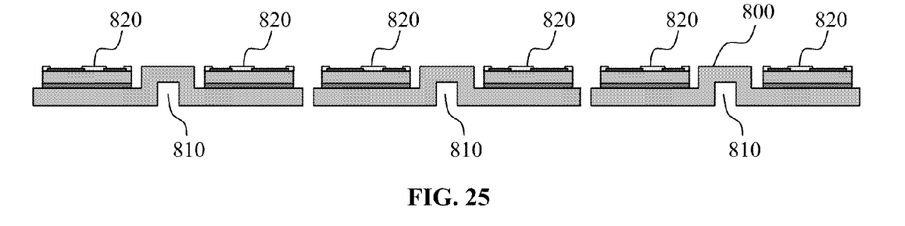
Figure 26:
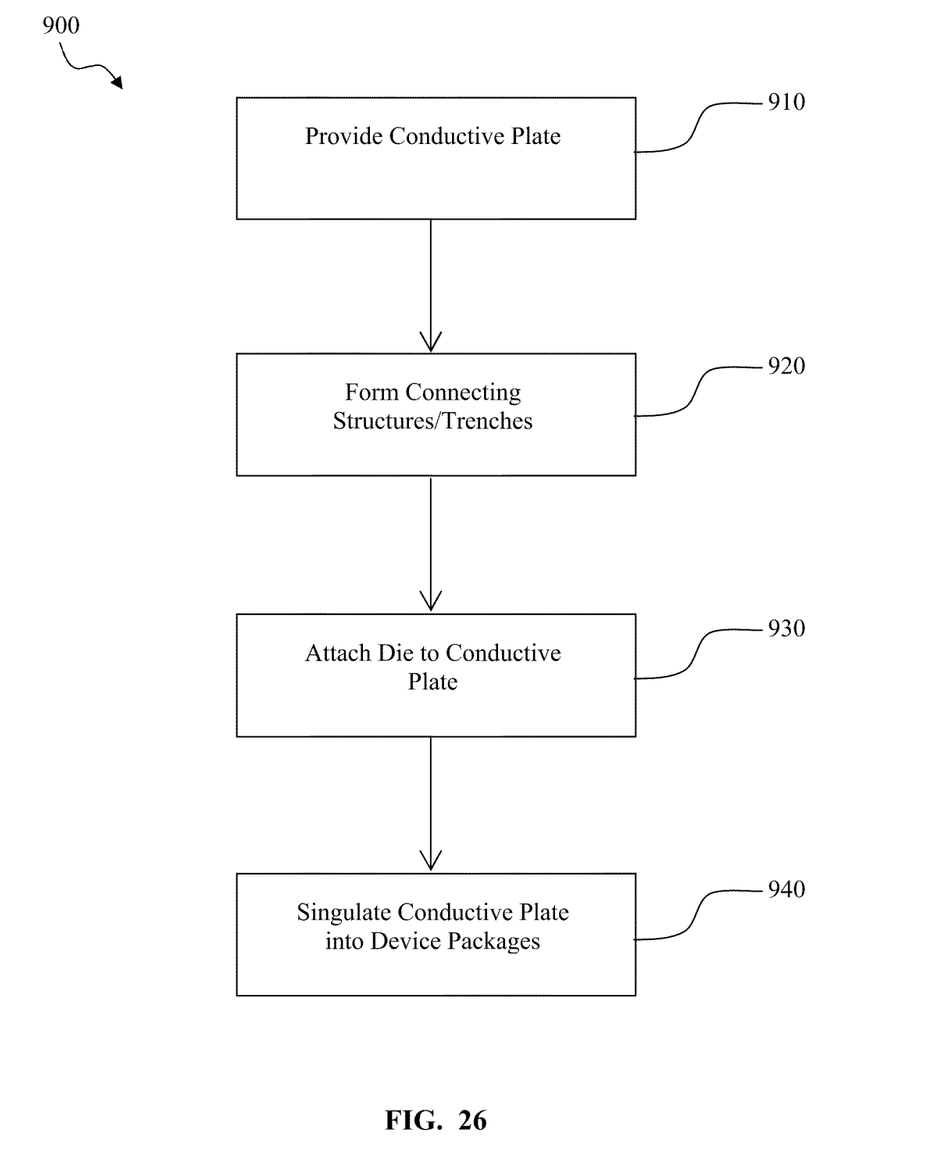
FIG. 26 is a flow chart showing method steps in accordance with the invention.

An eighth embodiment of a power semiconductor device package 700 in accordance with the invention is shown in FIGS. 20 and 21 and is similar to the sixth embodiment of semiconductor device package 500 of FIGS. 15-17. In contrast to the sixth embodiment, the conductive assembly 750 includes apertures 780 formed in a trench 760. The apertures 780 are shown as being rectangular but can be of any configuration and provide for better solderability and improved reliability.

An exemplary fabrication method 900 in accordance with the invention is shown in FIGS. 22 through 25 and FIG. 26. In a step 910 conductive plate 800 is provided. Connecting structures 810, which in this case are trenches, spacedly formed in the conductive plate 800 in a step 920. By way of example, the trenches may be formed by a stamping process. In a step 930, semiconductor dies 820 are spacedly attached to the conductive plate 800 such that a pair of semiconductor dies are disposed between adjacent trenches 810. Finally in a step 940, the conductive plate 800 is singulated into the power semiconductor device packages such that a pair of semiconductor dies 820 are separated by a trench 810.

The power semiconductor device package of the invention provides a package having both an exposed top surface and exposed semiconductor die for increased thermal dissipation. In the case where a pair of semiconductor dies coupled in parallel are accommodated in the package, the pair operate as a single device to provide more power handling capabilities.

The foregoing description of the embodiments of the invention has been presented for the purposes of illustration and description. It is not intended to be exhaustive or to limit the invention to the precise form disclosed. Many modifications and variations are possible in light of the above teaching. For example, any two semiconductor devices can be accommodated in the power semiconductor device packages of the third, fourth, fifth, sixth, seventh and eighth embodiments including a FET device and a diode, a pair of diodes and a pair of FETs connected in series (such as a high side FET and a low side FET), Nor is this invention limited to two semiconductor devices, for example, there may be a MOSFET on one side of the connecting structure, and another MOSFET and a diode on the other side. Furthermore, the FET devices can have different configurations of the contacts including having the drain and gate contacts on the same side. Additionally, the trenches can be of any configuration and shape. It is therefore intended that the scope of the invention be limited not by this detailed description, but rather by the claims appended hereto.

We claim:

1. A method of fabricating a power semiconductor device package comprising the steps of:
   providing a conductive plate;
   spacedly forming connecting structures on the conductive plate;
   attaching semiconductor die such that a pair of semiconductor die are disposed between adjacent connecting structures, wherein said connecting structure provides an electrical connection between a terminal of said semiconductor device and an external mounting surface, and wherein the connecting structure extends from a top surface of said power semiconductor device package to the bottom surface of said power semiconductor device package; and
   singulating the conductive plate into the power semiconductor device packages such that a pair of semiconductor die are separated by a connecting structure, wherein the pair of dies are placed side by side in the same plane and separated by the connecting structures.

2. The method of claim 1 wherein the connecting structures are trenches.

3. The method of claim 2 wherein spacedly forming connecting structures is performed by stamping the conductive plate.

4. The method of claim 2, wherein forming connecting structures on the conductive plate is performed such that the connecting structures terminate proximate to the plane of the side of the pair of semiconductor die opposite the side attached to the conductive plate.

* * * * *